(12) United States Patent
Yan et al.

(10) Patent No.: US 11,448,671 B2
(45) Date of Patent: Sep. 20, 2022

(54) SIGNATURE IDENTIFICATION FOR POWER SYSTEM EVENTS

(71) Applicant: GENERAL ELECTRIC COMPANY, Schenectady, NY (US)

(72) Inventors: Weizhong Yan, Clifton Park, NY (US); Honggang Wang, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 547 days.

(21) Appl. No.: 16/580,525

(22) Filed: Sep. 24, 2019

(65) Prior Publication Data
US 2021/0088563 A1    Mar. 25, 2021

(51) Int. Cl.
| | | |
|---|---|---|
| *G01R 19/25* | (2006.01) | |
| *G06N 3/08* | (2006.01) | |
| *G01R 31/08* | (2020.01) | |

(52) U.S. Cl.
CPC ..... *G01R 19/2513* (2013.01); *G01R 19/2516* (2013.01); *G01R 31/086* (2013.01); *G06N 3/08* (2013.01)

(58) Field of Classification Search
CPC ............ G01R 19/2513; G01R 19/2516; G01R 31/086; G06N 3/08
See application file for complete search history.

(56) References Cited

U.S. PATENT DOCUMENTS

| | | |
|---|---|---|
| 8,712,596 B2 | 4/2014 | Scott |
| 9,160,171 B2 | 10/2015 | Patterson et al. |
| 9,217,775 B2 | 12/2015 | Mousavi et al. |
| 9,746,511 B2 | 8/2017 | Wang et al. |

(Continued)

FOREIGN PATENT DOCUMENTS

CN         109145166 A         1/2019

OTHER PUBLICATIONS

Singer et al., "Model-Based Nuclear Power Plant Monitoring and Fault Detection: Theoretical Foundations", Intelligent System Applications to Power Systems, pp. 60-65, Seoul, Korea, Jun. 1997.

(Continued)

*Primary Examiner* — Scott Bauer
(74) *Attorney, Agent, or Firm* — Buckley, Maschoff & Talwalker LLC

(57) ABSTRACT

Briefly, embodiments are directed to a system, method, and article for identifying power system event signatures. Input measurement data may be received from one or more data sources relating to a power grid system. The input measurement data may comprise normal system operation measurement data and power system event measurement data. A processor may perform operations during an online application phase. During the online application phase, a feature matrix may be generated for the power system event measurement data and the at least one trained auto-associative model. The feature matrix for the power system event measurement data may be processed to determine power system event residuals. Also during the online application phase, the power system event signatures may be identified based on residual statistics for normal system operation measurement data residuals and on the power system event residuals.

20 Claims, 8 Drawing Sheets

(56) References Cited

U.S. PATENT DOCUMENTS

| | | | |
|---|---|---|---|
| 10,132,853 B2 | 11/2018 | Liang et al. | |
| 2012/0004869 A1* | 1/2012 | Saarinen | G01R 31/3274 |
| | | | 702/59 |
| 2017/0307676 A1 | 10/2017 | Gaouda et al. | |
| 2018/0189669 A1 | 7/2018 | Jeon | |
| 2018/0299877 A1* | 10/2018 | Cheng | H04L 41/00 |
| 2020/0212676 A1* | 7/2020 | Dehghanian | H02J 3/242 |
| 2020/0293033 A1* | 9/2020 | He | G06N 3/088 |
| 2020/0371142 A1* | 11/2020 | Liu | G01R 25/00 |

OTHER PUBLICATIONS

Stone, "The Auto-Associative Neural Network—a Network Architecture Worth Considering", 2008 World Automation Congress, pp. 1-4, Hawaii, 2008.

Lovef, "Probabilistic Auto-Associative Models and Semi-Linear PCA", Advances in Data Analysis and Classification, vol. 09, Issue:03, pp. 267-286, 2012.

Biswal et al., "Supervisory Protection and Automated Event Diagnosis Using PMU Data", IEEE Transactions on Power Delivery, pp. 1855-1863, vol. 31, Issue No. 4, Aug. 2016.

* cited by examiner

SIGNATURE IDENTIFICATION FOR POWER SYSTEM EVENTS

BACKGROUND

A power grid or electrical grid is an interconnected network for delivering electricity from producers to consumers. A power grid typically contains various pieces of equipment or assets. For example, a power system may include one or more generators, one or more substations, power transmission lines, and power distribution lines. A generator or generating station may generate electric power from sources of primary energy or may convert motive power into electrical power for transmission to a power electrical grid. A substation may be a part of an electrical generation, transmission, and distribution system. Between a generating station and consumer, electric power may flow through several substations at different voltage levels. A substation may include transformers to change voltage levels between high transmission voltages and lower distribution voltages, or at the interconnection of two different transmission voltages. Electric power transmission lines may facilitate bulk movement of electrical energy from a generating site, such as a power plant comprising one or more generators, to one or more electrical substations. The interconnected lines which facilitate this movement are known as a transmission network.

Power system events, such as, generator trips, line outages, and oscillations, happen frequently. Those events, if not detected early so that proper actions can be taken, can potentially escalate to wide-area oscillations and even a blackout. Therefore, event detection, identification, and location are important to enhance the wide-area situational awareness of power systems and prevent cascading failures.

Event detection may require knowledge of signatures of an event. Traditionally, the signatures of an event are defined by domain experts, which is incomplete and not scalable. Also, such expert defined signatures are defined based on raw measurements and a limited number of shallow features, which are limited to capture complex spatial-temporal characteristics of the event. Thus, limiting event detection performance (accuracy, robustness, timeliness).

SUMMARY

According to an aspect of an example embodiment, a system may identify power system event signatures. A receiver may receive input measurement data may be received from one or more data sources relating to a power grid system. The input measurement data may comprise normal system operation measurement data and power system event measurement data. During an online application phase, a feature matrix may be generated for the power system event measurement data and the at least one trained auto-associative model. The feature matrix for the power system event measurement data may be processed to determine power system event residuals. Also during the online application phase, the power system event signatures may be identified based on residual statistics for normal system operation measurement data residuals and on the power system event residuals.

According to an aspect of another example embodiment, a method may identify power system event signatures. Input measurement data may be received from one or more data sources relating to a power grid system. The input measurement data may comprise normal system operation measurement data and power system event measurement data. During an online application phase, a feature matrix may be generated for the power system event measurement data and the at least one trained auto-associative model. The feature matrix for the power system event measurement data may be processed to determine power system event residuals. Also during the online application phase, the power system event signatures may be identified based on residual statistics for normal system operation measurement data residuals and on the power system event residuals.

According to an aspect of another example embodiment, an article may comprise a non-transitory storage medium comprising machine-readable instructions executable by one or more processors. The instructions may be executable to perform operations during an offline training phase and during an online application phase. Input measurement data may be received from one or more data sources relating to a power grid system. The input measurement data may comprise normal system operation measurement data and power system event measurement data. During an online application phase, a feature matrix may be generated for the power system event measurement data and the at least one trained auto-associative model. The feature matrix for the power system event measurement data may be processed to determine power system event residuals. Also during the online application phase, the power system event signatures may be identified based on residual statistics for normal system operation measurement data residuals and on the power system event residuals.

Other features and aspects may be apparent from the following detailed description taken in conjunction with the drawings and the claims.

BRIEF DESCRIPTION OF THE DRAWINGS

Features and advantages of the example embodiments, and the manner in which the same are accomplished, will become more readily apparent with reference to the following detailed description taken in conjunction with the accompanying drawings.

Throughout the drawings and the detailed description, unless otherwise described, the same drawing reference numerals will be understood to refer to the same elements, features, and structures. The relative size and depiction of these elements may be exaggerated or adjusted for clarity, illustration, and/or convenience.

DETAILED DESCRIPTION

Figure 1:
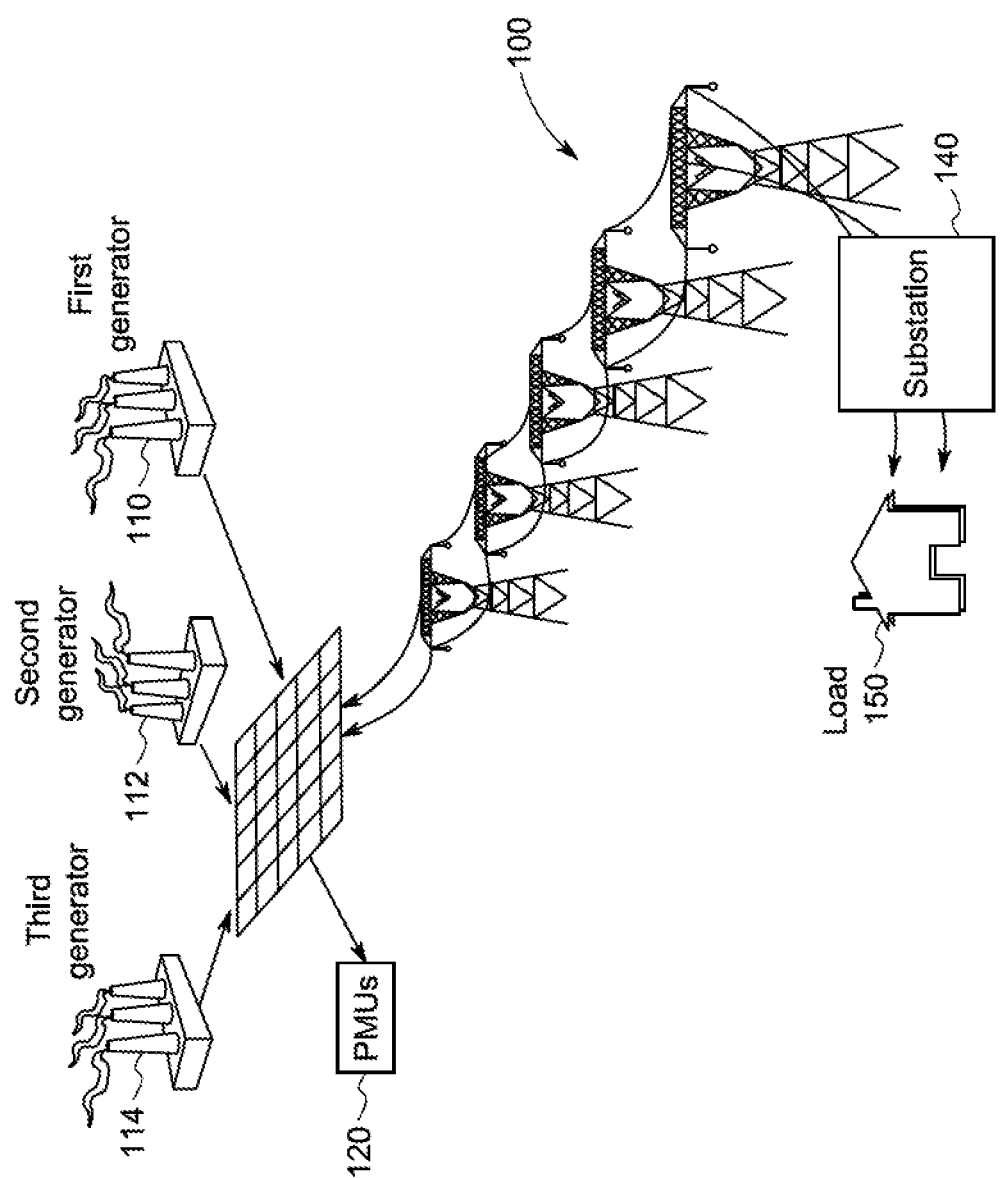
FIG. 1 illustrates an embodiment of a power distribution grid.

In the following description, specific details are set forth in order to provide a thorough understanding of the various example embodiments. It should be appreciated that various modifications to the embodiments will be readily apparent to those skilled in the art, and the generic principles defined herein may be applied to other embodiments and applications without departing from the spirit and scope of the disclosure. Moreover, in the following description, numerous details are set forth for the purpose of explanation. However, one of ordinary skill in the art should understand that embodiments may be practiced without the use of these specific details. In other instances, well-known structures and processes are not shown or described in order not to obscure the description with unnecessary detail. Thus, the present disclosure is not intended to be limited to the embodiments shown but is to be accorded the widest scope consistent with the principles and features disclosed herein.

One or more embodiments, as discussed herein, are directed to a system & method for identifying contributing factors (e.g., signatures) for power system events, such as, generator trips, line outages, and oscillations, for example. More specifically, a system & method as described herein within respect to one or more embodiments may comprise a data-driven, machine learning technique which may use real power system data, such as (PMU, SCADA, etc.) to identify signatures which are true contributing factors of the events. Such identified signatures may be used for event detection and other early warning and operator decision support tools for enhancing the reliability and resiliency of the national power grid.

A "signature," as used herein, refers to is anything which contributes to a power system event. A signature may include or identify one or more contributing factors to the power system event. A power system may be designed, for example, to use such a signature for event detection.

According to some embodiments, time-series data may be received from a collection of monitoring nodes (e.g., sensor, actuator, and/or controller nodes). Measurements of power, voltage, and frequency may be observed within a particular time window where various measurements are each associated with corresponding time stamps. Given a time window, such as five seconds or five minutes, depending on the particular application, for example, measurements of power, voltage, and/or frequency may be measured or otherwise observed for various nodes of a power system, such as every node of the power system in some embodiments. For example, a measurement may be taken every second during a particular time window in some implementations. Various statistics may be determined for measurements throughout the time window, such as mean, median, standard deviation, kurtosis, skewness, mode, median, quartile, range, interquartile range, and/or variance, to name just a few examples among many.

Features may be extracted from the time series data for each monitoring node. The term "feature" may refer to, for example, mathematical characterizations of data. Examples of features as applied to data may include the maximum and minimum, mean, standard deviation, variance, settling time, Fast Fourier Transform ("FFT") spectral components, linear and non-linear principal components, independent components, sparse coding, deep learning, etc. The type and number of features for each monitoring node, may be optimized using domain-knowledge, feature engineering, or ROC statistics. The features may be calculated over a sliding window of the signal time series and the length of the window (and the duration of slide) may be determined from domain knowledge and inspection of the data or using batch processing.

Signature identification using data-driven machine learning techniques may be treated as a feature selection problem. In the case where the number of samples for both normal system operation and events are sufficient, there are numerous feature selection methods available, including filter approaches, wrapper approaches, and embedding approaches. However, in real-world power system operation some events may rare occur, but with high consequence. For those rare, but high impact events, event samples may be very sparse. Comprehensive signatures may be determined based identified features which may capture spatial temporal characteristics and are identified through advanced data-driven machine learning techniques in order to achieve event detection and localization, for example.

One or more embodiments, as discussed herein, may better capture complex spatial-temporal characteristics of events by, e.g., utilizing advanced feature engineering techniques to generate a large number of sophisticated features, as opposed to using limited knowledge-based engineering signatures in traditional approaches. Use of defined signatures may lead to improved event detection. An auto-associative modeling process or method may be utilized herein to identify signatures for events with relatively few samples.

One or more embodiments, as discussed herein, generally comprises a power and substation monitoring system, or a corresponding monitoring system thereof. For example, the monitoring of the state of substation assets may be performed in accordance with an embodiment at a subsecond rate, such that early warning indications may be provided for potentially malfunctioning equipment, and equipment may be proactively replaced and/or repaired before the equipment becomes damaged. Accordingly, an electric utility's incidence of forced outage of equipment and capital replacement costs may be reduced, and catastrophic failures and collateral damage may thereby be avoided. In one aspect, a Phasor Measurement Units (PMU) application may be extended to substation asset monitoring, for example.

A "Phasor Measurement Unit" or "PMU," as used herein, refers to a device used to estimate the magnitude and phase angle of an electrical phasor quantity (such as voltage or current) in a power grid using a common time source for synchronization. Time synchronization may be provided by Global Positioning System (GPS) coordinates and may allow for synchronized real-time measurements of multiple remote points on an electricity grid. PMUs may be capable of capturing samples from a waveform in quick succession and reconstructing a phasor quantity, made up of an angle measurement and a magnitude measurement, for example. A resulting measurement is known as a "synchrophasor." Such time synchronized measurements may be monitored, for example, because if a power grid's supply and demand are not perfectly matched, frequency imbalances may cause stress on the power grid, potentially resulting in power outages.

PMUs may also be used to measure a frequency in a power grid. A typical commercial PMU may report measurements with very high temporal resolution in the order of 30-60 measurements per second, for example. Such measurements may assist engineers in analyzing dynamic events in the power grid which may not be possible with traditional Supervisory Control and Data Acquisition (SCADA) measurements which generate one measurement every 2 or 4 seconds. PMUs may therefore equip utilities with enhanced monitoring and control capabilities and are considered to be one of important measuring devices in the future of power systems. A system may include one or more receivers or transceivers, for example, to receive signals comprising measurements or parameters from one or more PMUs.

In accordance with one or more embodiments, a machine learning-based power substation asset monitoring system is provided which may determine various signatures corresponding to different power system events. For example, such a machine learning-based power substation asset monitoring system may receive and process data from various sources, such as a PMU data, SCADA data, and other various operational and non-operational information and may output one or more identified power system event signatures. Such a system may include components to perform operations such as feature generation or extraction, auto-associative model building, residual generation, residual generation, and signature identification, as discussed in more detail below. Features may comprise individual quantities extracted from one or more measured data streams.

A power substation asset monitoring system in accordance with one or more embodiments, as discussed herein, may comprise an analysis module which may acquire input measurement data from different sources. The system may perform various analyses offline, such as pre-processing and extracting features from event logs and other sources of normal power system operation data and power system event data indicative of a power system event. The system may generate one or more auto-associative models based on the extracted features from the normal data and generate residuals based on features extracted from the event data and processed via the one or more auto-associative models. Residual analysis may be performed based on the one or more auto-associative models. Signature identification may be performed based on the residuals generated from the features from the event data and based on the residual analysis of the one or more auto-associative models. One or more signatures may subsequently be utilized to detect or predict detection of a power system event, for example.

An asset monitoring system may be improved in accordance with an embodiment, for example, to provide an automatic solution (e.g., software) to correlate PMU captured event data to determine a status of an asset or equipment based on a detected event signature. PMU data may be analyzed to provide a relatively fast diagnosis (e.g., at a subsecond level) to avoid more severe equipment failure or explosion, for example.

A systematic approach is provided in accordance with an embodiment as discussed herein to unleash the power of the big volume of PMU data together with operational and non-operational data, along with the help of advanced artificial intelligence (AI) and/or machine learning (ML) technology for asset monitoring and diagnosis, for example.

An embodiment, as discussed herein, may perform anomaly detection and may also provide anomaly localization to a component level based on one or more identified or determined power system events.

Relatively few labeled data (such as PMU data) may currently be available because PMU installations have only recently been performed. A traditional deep learning approach may suffer from overfitting or poor generalization performance with a relatively small sample size data and unbalanced data (e.g., a lot of normal data but very few data for a certain anomalies). A data source may be extended from not only a simulator, but also from an equipment failure mode data sheet and publicly available PMU related asset data, for example. Furthermore, a data augmentation approach augmentation may be utilized such as Jittering, bootstrapping, and generative modeling, to name just a few examples, to enhance the classifier's prediction accuracy and generalization capability. Ensembles of different similarity metrics, time and frequency transformations, single component and multiple component interaction features may additionally be leveraged to further enhance a classifier's accuracy, for example.

With the proliferation of PMU installations, synchrophasor technology offers unprecedented visibility into what is happening on the grid as a whole, and into what is happening with individual power plants and pieces of grid equipment. Synchrophasor systems enable better electric system observation and problem diagnosis because synchrophasor technology synchronously samples and records grid conditions with unprecedented speed and granularity. While SCADA systems sample grid conditions every 2 to 15 seconds, PMUs measure frequency, voltage phasors, and current phasors at the rate of 30 to 120 samples per second and calculate real and reactive power values from those phasor measurements. Thus, PMUs can capture dynamic and transient events that are not seen in SCADA monitoring. Every phasor measurement and calculated value is time-synchronized against Universal Time (within 1 microsecond, as determined using GPS), producing accurate, time-aligned measurements that may be compared and tracked across wide geographic areas. This makes it easier to correctly identify and diagnose events occurring across a large region.

One or more embodiments may provide a software solution to perform signature identification or determination to facilitate PMU based asset monitoring. For example, one or more embodiments may provide an automatic solution (software) to correlate a PMU captured event with an asset status. One of more embodiments may also provide a systematic approach to unleash a big volume of PMU data together with other related large volumes operational and non-operational data, and the power of advanced Artificial Intelligence (AI)/Machine Learning (ML) technology for asset monitoring and diagnosis.

Various assets and related monitoring equipment may generate large volumes operational and non-operational data. Examples of operational data include information such as voltage, current, breaker status, and other information which may be used to monitor and control operation of a substation and other elements of the transmission and distribution system on a substantially real time basis. Example of non-operational data include analytical data (e.g., digital fault records target records, load profiles, power quality, sequence of events, and the like), equipment condition information (e.g., equipment temperature, dissolved gasses, operating and response times, and so on), and temperature, rainfall, and other ambient condition information. Both operational and non-operational data may have relatively substantial value for monitoring and analyzing the operation of a particular asset.

Accordingly, a related software solution as discussed herein may provide various benefits, such as enabling or facilitating PMU based asset monitoring. In one embodiment, as discussed below, an automatic solution (e.g., software) may correlate a signature of a PMU-captured event to determine a status of an asset.

Given an event captured by PMU data or other types of data such as SCADA, for example, one or more embodiments as discussed herein may be able to determine whether the event signifies the failure, degradation or malfunction of instrument transformer, or power transformer or other components such as circuit breaker, etc.

One or more embodiments, as discussed herein, may address various technical challenges. First, there is a lack of knowledge base to correlate PMU data effect and the asset failure mode. Even though failure modes for instruments (e.g., CT, VT, CCVT) and equipment (e.g., Power Xfmr, Bushing, Circuit Breaker) are well-established, their behavior in the sub-second level has not been fully understood. The activity of correlating PMU data to asset failure has only recently begun and little or nothing is known about a correlation between PMU and rarely occurring asset failures.

A second technical challenge is that there is a lack of PMU dataset which correlates PMU data effect and an asset failure mode. Asset owners may not publicly share their assets failures and corresponding PMU data may differ for different asset owners. Each asset owner may have only a few event histories with equipment failure.

A third technical challenge is that it is not straightforward to align PMU data with other source data, which may include SCADA data, state estimator data, messaging data, alarm data and/or static data (e.g., network topology, line impedance loads).

A fourth technical challenge is that for a certain PMU events (e.g., signatures), there may be multiple failure modes corresponding to them due to the limitations of PMU installation locations and available measurement channels.

A fifth technical challenge is that a PMU based event detection and diagnosis be as fast as possible or (sub-second level) be able to take remedy actions for certain failures, such as s bushing failure.

FIG. 1 illustrates an embodiment 100 of a power distribution grid. The grid of embodiment 100 may include a number of components, such as one or more power generators, for example, a first generator 110, second generator 112, and/or third generator 114. Although only three generators are shown in FIG. 1, it should be appreciated that more or fewer than three generators may be utilized in accordance with an embodiment. The grid of embodiment 100 may include transmission networks, transmitting electrons from power generator to one or more substations, such as substation 140, and distribution networks to various loads or users. In embodiment 100, for example, electrons may be transmitted from substation 140 to various loads, such as load 150. Although only a single substation 140 is illustrated in FIG. 1, it should be appreciated that numerous substations may be included in some embodiments, such as where electric power is transmitted from one or more generators to different geographically dispersed loads, for example. Similarly, although only a single load 150 is illustrated in FIG. 1, multiple loads may be included in some embodiments, where the multiple loads draw power from the power distribution grid in accordance with an embodiment.

There are numerous assets located within or along the power distribution grid, between one or more generators, such as first generator 110, and load 150. An "asset" or "electrical asset," as used herein, refers to an item, such as one or more components of equipment, involved in generation and/or transmission of electrical power between one or more generators and one or more loads or consumers of the electrical power. Assets may include items such as transformers, generators, transmission lines, distribution lines, capacitor banks, circuit breakers, surge arresters, as well as instrument sensors such as current transformers (CT), voltage transformers (VT), and capacitor voltage transformers (CVT/CCVT).

If any of the assets becomes damaged or otherwise malfunctions, a portion of the power grid may become at least temporarily inoperable, partially or fully. For example, if one or more transformers becomes damaged, there is a potential for malfunction of a portion of the power distribution grid, which may result in at least a temporary partial power blackout. Accordingly, by detecting a signature from input data which matches a signature for a power system event, an anomaly may be identified before an asset failure, for example.

Signatures may be identified for various power system events, including for relatively rare, but impactful power system events. An embodiment as discussed herein may be capable of identifying more comprehensive signatures than traditional knowledge-based signatures by, e.g., using advanced feature generation and feature selection processes. An example technique as discussed herein may be used for power system events as well as other asset events or faults, for example.

In accordance with one or more embodiments, techniques are provided which may enable identification of relatively comprehensive signature for power system events. Such techniques may involve use of advanced feature generation/selection and auto-associative modeling techniques for signature identification, such as for situations where event samples are sufficiently large as well as situations where event samples are relatively sparse. Traditional knowledge-based signatures or statistical tests for event signature identification may not work for situations where event samples are small, or fail to identify an optimal set of signatures, resulting in inferior predictive performance for analytics (e.g., event detection and other operation decision support tools) that use identified signatures as inputs.

Figure 2:
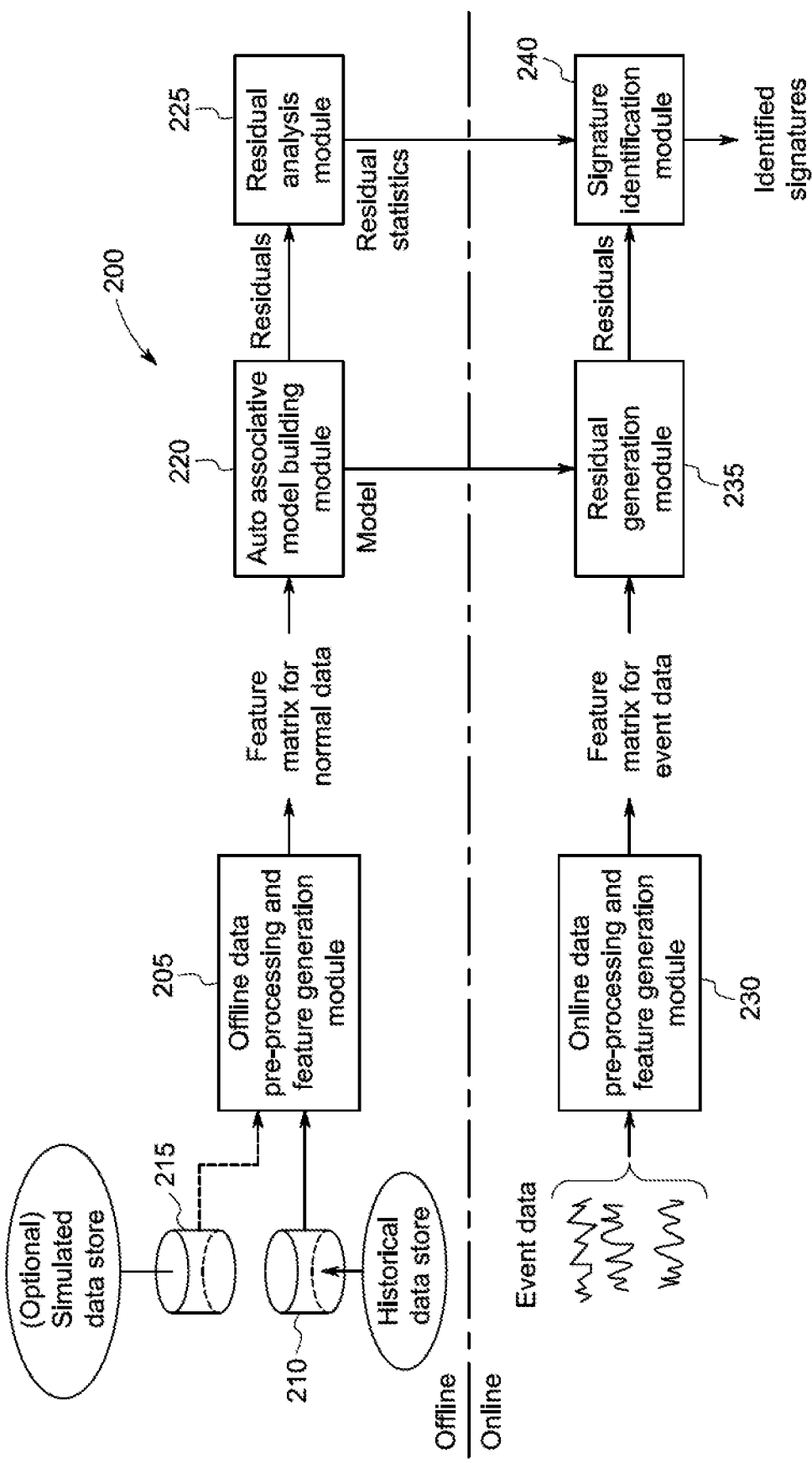
FIG. 2 is a functional block diagram of an embodiment of a process for identifying signatures for events.

FIG. 2 is a functional block diagram of an embodiment 200 of a process for identifying signatures for events. As shown in embodiment 200, the process may be trained in an offline phase or mode and may subsequently be implemented in an online monitoring and diagnosis phase or application. During the offline phase or mode, for example, training or normal data may be utilized to build an auto-associative model. During the online phase or mode, for example, event data may be applied to the auto-associative model to obtain residuals. "Normal data" or "normal system operation data," as used herein, refers to data such as measurements, for a power system and/or one or more assets thereof, during a regular operation, such as where the data falls within an expected measurement range. Normal data may include previously recorded or observed measurements in an historical data store 210. Normal data may include PMU data, SCADA data, other grid-related data, and/or event logs, for example. Normal data may also optionally include simulated data in a simulated data store 215, for example. "Event data," as used herein, refers to data such as measurements, for a power system and/or one or more assets thereof, when an abnormal operation is observed, such as in response to a particular event such as a power grid and/or an asset failure, for example. Event data may be received from various nodes of a power system where various measurements were observed.

The normal data may be acquired from historical data store 210 and optionally from simulated data store 215 or may otherwise be transmitted or provided to an offline data pre-processing and feature general module 205, for example. The data pre-processing may comprise performance of operations such as outlier detection and missing data treatment, for example. Outlier detection may be performed to determine which of the data deviates beyond a certain threshold amount, such that it may be indicative of abnormal operation, for example. Missing data may be identified within the received data such as where it is determined from time stamped data that date for a certain time range or period is omitted from data received or obtained from historical data store 210 and/or simulated data store 215.

Feature generation may be performed to extract a set of salient signatures/features from raw measurements in the input or normal data from historical data store 210 and/or simulated data store 215. Such features may best capture an underlying system behavior or characteristics, such as, e.g., spatial-temporal relationships among the raw measurements. For feature generation, techniques from different technical domains, such as, e.g., knowledge-based, statistical-based, signal processing-based processes including application of a fast Fourier transform (FFT), transformation-based processes such as Principal component analysis (PCA), and learning-based processes may be used. Feature generation may be utilized to generate a feature matrix for normal data.

With the feature matrix for the normal data, an auto associative model may be generated or built and trained. An auto-associative model may comprise an approximation of an identity mapping between the inputs and the outputs. Auto associative model may comprise an autoencoder neural network or a similarity-based model (SBM). An autoencoder neural network which may implement an autoencoder algorithm is discussed below with respect to FIG. 7. Once the auto-associative model is trained using the normal data, the residuals, differences between predicted and true outputs for the same given inputs, may obtained. A distribution and various other statistics including, e.g., mean and standard deviation, of the residuals may be calculated for each input variable in accordance with an embodiment.

For signature identification, e.g., to identify contributing factors for an event, the event data, after preprocessing and/or other types of normalization, may be transmitted or otherwise sent to auto-associative model building module 220 to generate auto-associative models. Residuals determined by applying the feature matrix for the normal data to the trained auto-associative models may be provided to a residual analysis module 225. The residuals may indicate differences between model values and actual normal data from which the models were generated. A residual analysis module 225 may process or analyze the residuals to determine certain characteristics regarding the residuals, including values such as maximum, mean, or standard deviation, to name just a few characteristics among many.

During an online application mode, event data may be received by an online data pre-processing and feature generation module 230. The data pre-processing may comprise performance of operations such as outlier detection and missing data treatment, for example. Outlier detection may be performed to determine which of the data deviates beyond a certain threshold amount, such that it may be indicative of abnormal operation, for example. Missing data may be identified within the received data such as where it is determined from time stamped data that date for a certain time range or period is omitted from received event data. Feature generation may be performed to extract a set of salient signatures/features from raw measurements in the event data. Such features may best capture an underlying system behavior or characteristics, such as, e.g., spatial-temporal relationships among the raw event data measurements.

Online data pre-processing and feature generation module 230 may output a feature matrix for event data to a residual generation module 235. Residual generation module 235 may apply the feature matrix for event data to one or more models received from auto-associative model building module 220 to determine residuals. A signature identification module 240 may process residuals received from residual generation module 235 and residual statistics received from residual analysis module 235. Signature identification module 240 may rank and select signatures for use in detected power system events based on the residuals and residual statistics. For example, signatures may be ranked based on how well they model data. In one particular embodiment, the signatures may be directly based on the residuals generated by residual generation module 235. In another embodiment, the statistics obtained from residual analysis module 235 may be used to normalize the generated residuals, in which case the signatures may be ranked based on the normalized residuals, for example.

Signature identification may be performed at three levels in accordance with one or more embodiments. At a first level, the signature identification may be performed using all PMUs in a power system. At a second level, the signature identification may be performed on a subset of the PMUs. At a third level, the signature identification may be performed using a single PMU. A decision of at which level to perform signature identification may be based on an occurrence of certain events and how much topological information is known about the events. For events with a sufficient number of event samples, e.g., there may be an option to choose classifier-based feature ranking/selection methods, instead of an auto-associative model-based approach as disclosed herein.

Figure 3:
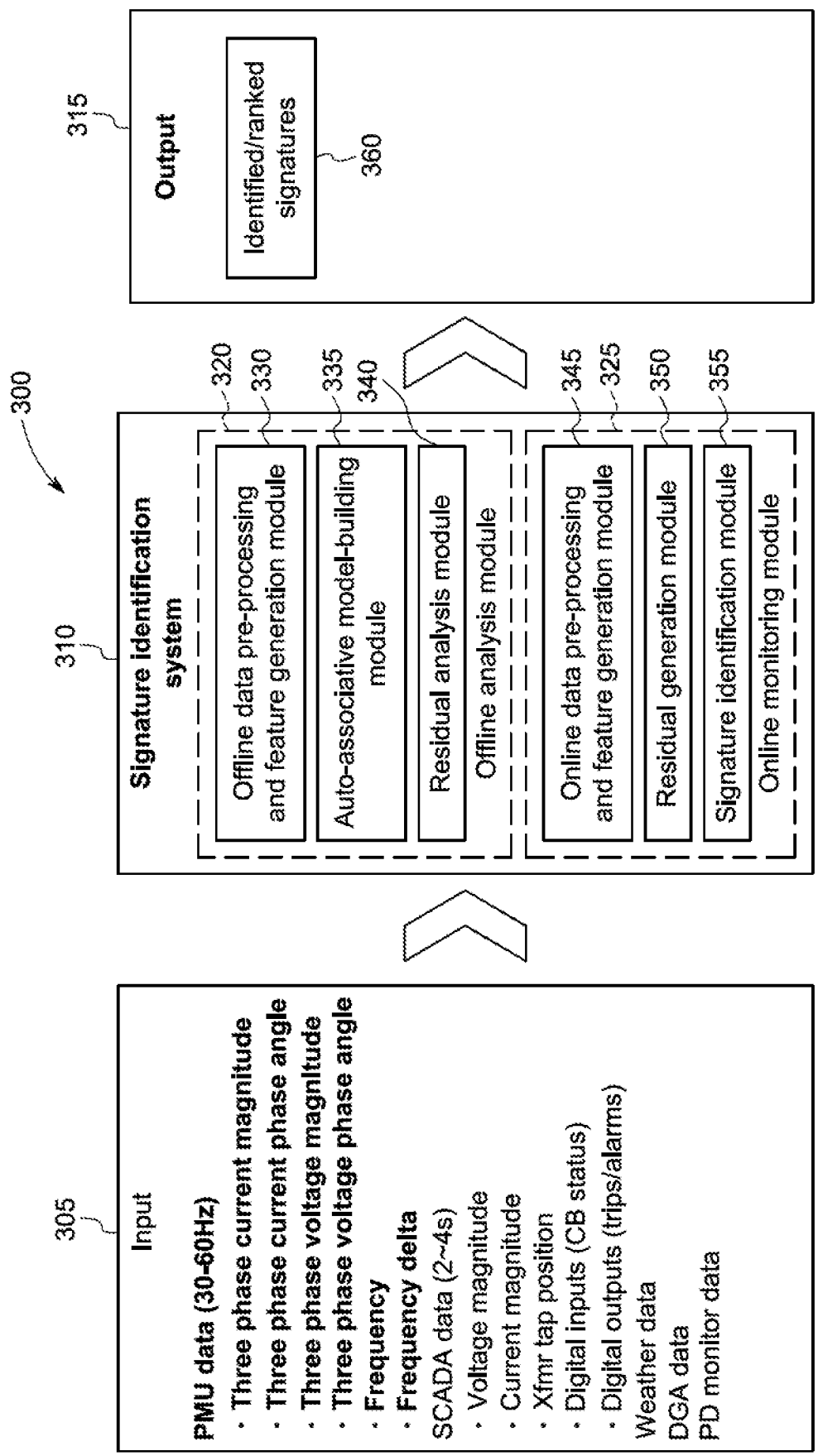
FIG. 3 illustrates an embodiment a system diagram of a signature identification system and corresponding inputs and outputs according to an embodiment.

FIG. 3 illustrates an embodiment 300 a system diagram of a signature identification system 310 and corresponding inputs 305 and output 315 according to an embodiment. As illustrated, various inputs may include PMU data (30-60 Hz), SCADA data (e.g., at 2-4 seconds), weather data, DGA data, and PD monitor data, for example. PMU data may include three phase current magnitude, three phase current phase angle, three phase voltage magnitude, three phase voltage phase angle, frequency, and frequency delta, for example. SCADA data may include voltage magnitude, current magnitude, transformer (Xfmr) tap position, digital inputs (e.g., circuit breaker (CB) status), and digital outputs (e.g., trips/alarms), for example.

Outputs of embodiment 300 include identified and/or ranked signatures 360. For example, signatures which best match input data may be selected. Such signatures may be ranked based, in part, on how accurately or closely they match input data.

Signature identification system 310 may include one or more items, such as an offline analysis module 320 and an online monitoring module 325. Offline analysis module 320 may include an offline data pre-processing and feature generation module 330, an auto-associative model-building module 335, and a residual analysis module 340, for example. Online monitoring module 325 may include an online data pre-processing and feature generation module 345, a residual generation module 350, and a signature identification module 355, for example.

Embodiment 300 of FIG. 3 may include one or more modules similar to those described above with respect to embodiment 200 of FIG. 2 to, e.g., identify and/or rank one or more signatures for power system based on various input data.

Offline data pre-processing and feature generation module 330 may receive input data comprising normal data. Online data pre-processing and feature generation module 345 may receive input data comprising event data. The data pre-processing performed by modules 330 and 345 may comprise performance of operations such as outlier detection & treatment and missing data treatment. The data pre-processing performed by modules 330 and 345 may calculate various features over a sliding window of time-series measurements of input data, such as PMU data and/or SCADA data, for example. To tackle an issue where different data may have different sampling rates, features calculations may be performed separately for different data sources over the sliding window and may subsequently be concatenated together (e.g., via feature-level fusion) to form a feature vector for each sliding window, for example. Outlier detection may be performed to determine which of the data deviates beyond a certain threshold amount, such that it may be indicative of abnormal operation, for example. Feature generation may be performed to extract a set of salient signatures/features from raw measurements in the input data. Such features may best capture an underlying system behavior or characteristics, such as, e.g., spatial-temporal relationships among the raw measurements. For feature generation, techniques from different technical domains, such as, e.g., knowledge-based, statistical-based, signal processing-based processes including application of an FFT, transformation-based processes such as PCA, and learning-based processes may be used. Feature generation may be performed by offline data pre-processing and feature generation module 330 to generate a feature matrix for normal data. Feature generation may be performed by online data process-processing and feature generation module 345 to generate a feature matrix for event data.

With the feature matrix for the normal data, auto-associative model-building module 335 may build an auto associative model with the feature matrix for normal data. The auto associative model may comprise an autoencoder neural network or a similarity-based model (SBM). Once the auto-associative model is trained using the normal data, residuals may be obtained and provided to a residual analysis module 340 and the auto-associative model may be provided to residual generation module 350. Residuals may comprise differences between predicted and true outputs for the same given inputs. Residual generation module 350 may generate residuals, multiple physical models of subsystems or components of the substation are built first for capturing the underlying system's physical behaviors under normal operation conditions.

A distribution and various statistics including, e.g., mean, maximum, and standard deviation, to name just a few examples, of the residuals may be calculated by residual analysis module 340 for each input variable in accordance with an embodiment. Residual generation module 350 may receive a feature matrix for event data from online data pre-processing and feature generation module 345 and one or more auto-associative models from auto-associative model-building module 335. Residual generation module 350 may apply feature matrix for event data to the one or more received auto-associative models to determine residuals which may be provided to signature identification module 355.

Signature identification module 355 may rank and select signatures for use in detected power system events. For example, signatures may be ranked based on how well they model data. In one particular embodiment, the signatures may be directly based on the residuals generated by residual generation module 350. In another embodiment, the statistics obtained from residual analysis module 340 may be used to normalize the generated residuals, in which case the signatures may be ranked based on the normalized residuals, for example.

Physical models utilized by signature identification system 810 may be built using first principal or data-driven methods, for example. First principal models may often be built in an original measurements space, while data-driven models may often be built in a feature space. The data-driven models may be built using one of many methods available, such as density estimation-based (e.g., Gaussian mixture models), instance-based (e.g., similarity-based modeling), and/or auto-associative neural networks, e.g., auto-encoders, to name just a few examples among many.

Figure 4:
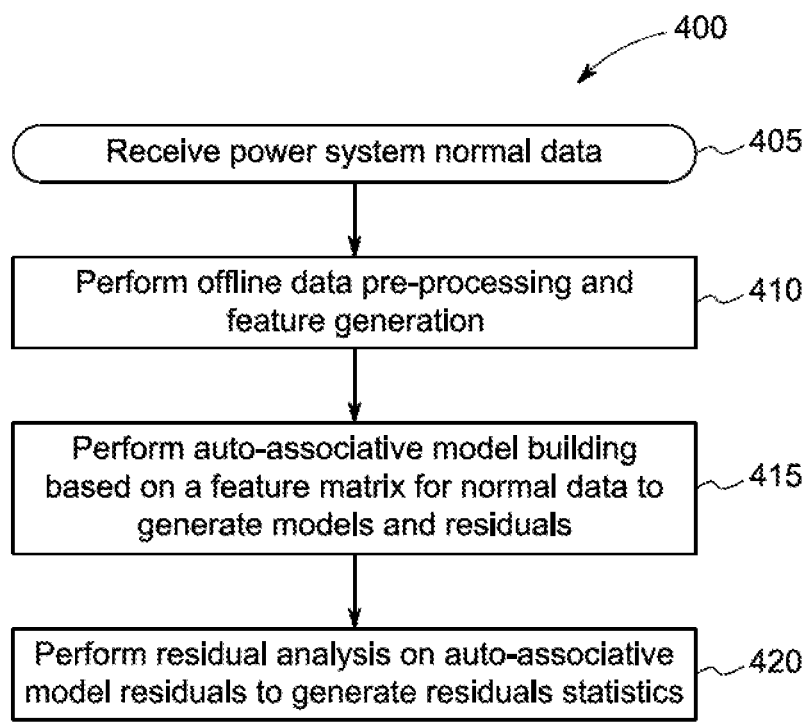
FIG. 4 illustrates an embodiment of an offline portion of a process for identifying signatures for power system events.

FIG. 4 illustrates an embodiment 400 of an offline portion of a process for identifying signatures for power system events. For example, embodiment 400 may comprise a process which may be implemented by offline analysis module 320 of signature identification system 310 of embodiment 300 as shown in FIG. 3. Embodiments in accordance with claimed subject matter may include all of, less than, or more than blocks 405 through 420. Also, the order of blocks 405 through 420 is merely an example order.

At operation 405, power system normal data may be received. As discussed above, the normal data may include PMU data, SCADA data, weather data, DGA data, and PD monitor data, and/or other power grid-related data, for example. At operation 410, offline data pre-processing and feature generation may be performed to determine a feature matrix for normal data, for example. Auto-associative model building may be performed based on the feature matrix for the normal data at operation 415 to determine one or more auto-associative models and to determine residuals between values predicted by the models and actual measurement values of the normal data. A residual analysis may be performed on the residuals determined from application of the feature matrix of normal data to the one or more auto-associative models at operation 420. Residual statistics, such as median, maximum, and/or standard deviation values may be determined as a result of the residual analysis at operation 420, for example.

Figure 5:
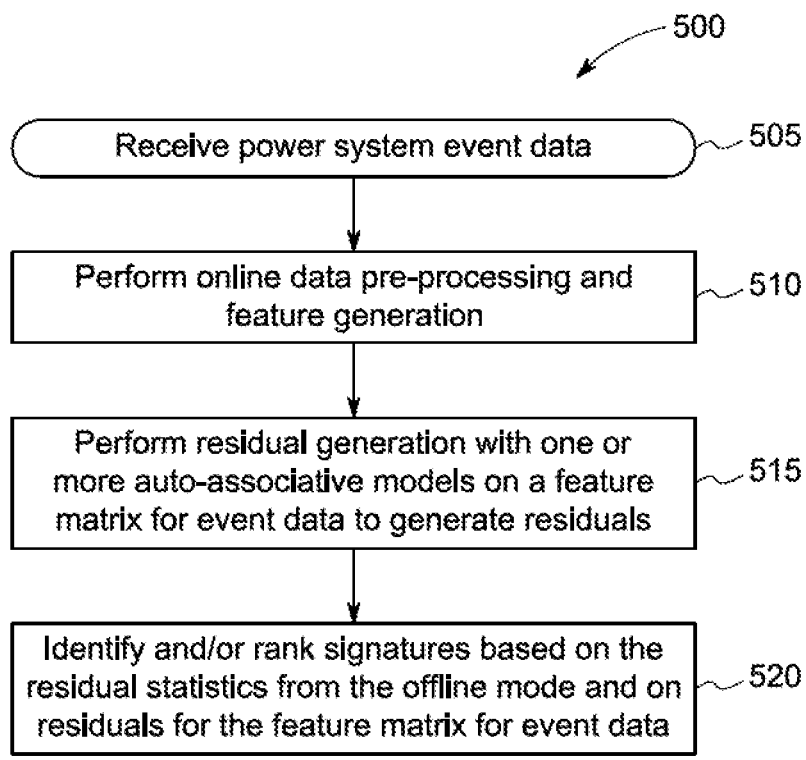
FIG. 5 illustrates an embodiment of an online portion of a process for identifying signatures for power system events.

FIG. 5 illustrates an embodiment 500 of an online portion of a process for identifying signatures for power system events. For example, embodiment 500 may comprise a process which may be implemented by online monitoring module 325 of signature identification system 310 of embodiment 300 as shown in FIG. 3. Embodiments in accordance with claimed subject matter may include all of, less than, or more than blocks 505 through 520. Also, the order of blocks 505 through 520 is merely an example order.

At operation 505, power system event data may be received. As discussed above, the event data may include PMU data, SCADA data, weather data, DGA data, and PD monitor data, and/or other power grid-related data, for example. At operation 510, online data pre-processing and feature generation may be performed to determine a feature matrix for event data, for example. A residual generation process may be performed on the feature matrix for the event data via application of one or more auto-associative models to generate residuals at operation 515. At operation 520, the one or more residuals determined based on the feature matrix for event data and the residual statistics for normal data determined via an offline analysis module may be received and may be utilized to identify and/or rank signatures for power system events, for example.

Figure 6:
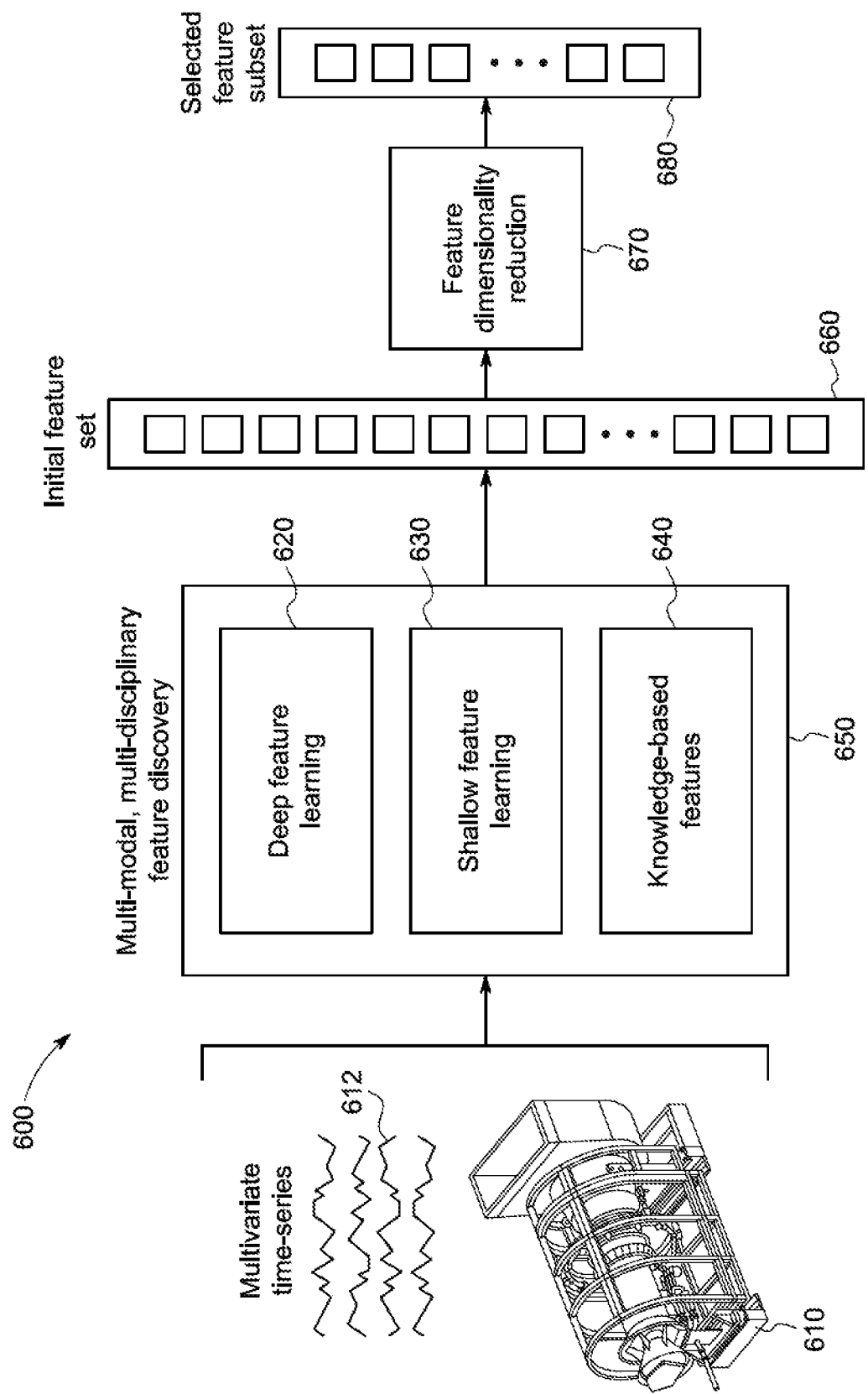
FIG. 6 is a feature vector information flow diagram wherein a heterogeneous set of data sources are associated with an industrial asset.

FIG. 6 is a feature vector information flow diagram 600 wherein a heterogeneous set of data sources are associated with an industrial asset 610. For example, a method in accordance with feature vector flow diagram 600 may be utilized to perform feature extraction. The data sources may include, for example, multivariate time-series information 612 (e.g., from sensor nodes) that is provided to multi-modal multi-disciplinary (MMMD) feature discovery 650 which generates an initial feature set 660. The MMMD feature discovery 650 may include, according to some embodiments, deep feature learning 620, shallow feature learning 630, and/or knowledge-based features 640. Because the initial feature set 660 may be relatively large, a feature dimensionality reduction process 670 may be utilized to create a selected feature subset 680.

The information flow diagram 600 may achieve improved detection performance by maximally leveraging information from both conventional sensor data (e.g., sensor measurements from gas turbines) and unconventional data through multi-modal, multi-disciplinary feature discovery 650. Given the heterogeneous data types, the system may extract features from each individual data source using different feature extraction methods and then combine the results to create the initial feature set 660 (this "combining" process is often referred as "feature fusion" in machine learning and data-mining domains). Because the initial feature set 660 is likely substantially large, the system then applies feature dimensionality reduction 670 techniques to reduce the number of features to a reasonable level before the selected feature subset 680 is used by an anomaly detection engine.

Note that the MMMD feature discovery 650 may include some or all of knowledge-based feature 640 engineering, shallow feature learning 630, and deep feature learning 620. Knowledge-based feature 640 engineering may use domain or engineering knowledge of gas turbine 610 physics to create features from different sensor measurements. These features may simply be statistical descriptors (e.g., maximum, minimum, mean, variance, different orders of moments, etc.) calculated over a window of a time-series signal and its corresponding Fast Fourier Transformation ("FFT") spectrum as well. The knowledge-based features 640 may also utilize a power system analysis, such as basis vector decomposition, state estimation, network observability matrices, topology matrices, system plant matrices, frequency domain features and system poles and zeros. These analyses may represent a characterization of the current gas turbine 610 operation through steady-state, transient, and small signal behaviors.

Although knowledge-based feature 640 engineering is a traditional approach for feature extraction, it is often a laborious, manual process. The approach is also very application specific, and therefore not generalizable or scalable. Learning features directly from data (e.g., via machine learning) may address these issues. For example, shallow feature learning 630 techniques include many unsupervised learning (e.g., k-means clustering), manifold learning and nonlinear embedding (e.g., isomap methods and Locally-Linear Embedding ("LLE")), low-dimension projection (e.g., Principal Component Analysis ("PCA") and Independent Component Analysis ("ICA")), and/or neural networks (e.g., Self-Organizing Map ("SOM") techniques). Other examples of shallow feature learning 630 techniques include genetic programming and sparse coding. The deep feature learning 620 may represent a sub-field of machine learning that involves learning good representations of data through multiple levels of abstraction. By hierarchically learning features layer by layer, with higher-level features representing more abstract aspects of the data, deep feature learning 620 can discover sophisticated underlying structure and features.

The multi-modal, multi-disciplinary feature discovery 650 (or "extraction") will most likely lead to a large number of features in the initial feature set 660. Moreover, many redundant features may exist. Directly using such a large number of features may be burdensome for down-stream anomaly detection models. As a result, feature dimensionality reduction 670 may reduce the number of features by removing redundant information while maximally preserving useful information of the features. Embodiments described herein may be associated with feature selection and/or feature transformation techniques.

By combining knowledge-based feature 650 engineering and advanced deep feature learning 620 techniques (and applying those to different data sources), the MMMD feature discovery 650 framework may be effective in discovering a feature set that provides accurate and reliable threat detection. Note that the framework is generic (and can be used effectively for other analytics applications) and flexible in handling situations where the numbers and the types of available data sources vary from system to system.

Figure 7:
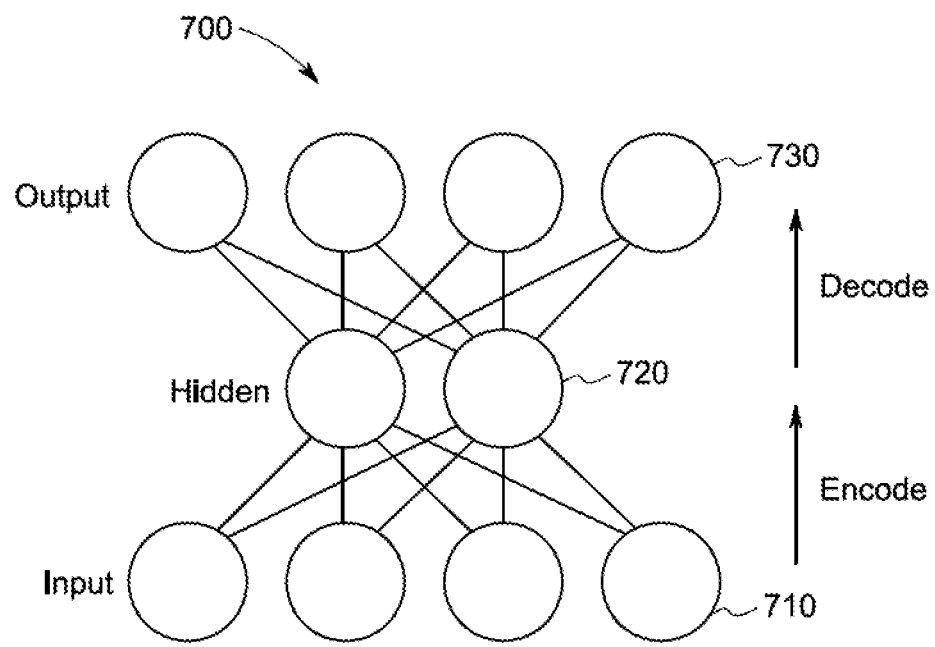
FIG. 7 illustrates layers of an autoencoder algorithm in accordance with some embodiments.

FIG. 7 illustrates layers of an autoencoder algorithm 700 in accordance with some embodiments. For example, autoencoder algorithm 700 may be utilized to implement an auto-associative neural network to generate one or more auth-associative models in accordance with embodiment 200 of FIG. 2. In particular, an encode process may turn raw inputs 710 (e.g., time-series measurements) into hidden layer 720 values. A decode process turns the hidden layer 720 values into output 730 (e.g., the latent representation). Note that the number of hidden nodes may be specified and may correspond to a number of features to be learned. According to some embodiments, an autoencoder may be constructed as an optimization problem. For example, the error function, mean-squared error to minimize and find W, b, and d' may be performed as follows:

$$\min E(W,b,d') = \min_{W,b,d} \Sigma\Sigma_{j=1}^{P} \|(x_j - g_\theta(f_\theta(x_j)))\|^2 \quad \text{[Relation 1]}$$

where $x_j$ corresponds to samples of data and P is equal to the number of samples.

Note that an autoencoder implementation may use the cross entropy error function instead of mean squared error. Moreover, an expected value may be required when using cross entropy:

$$\min E(W,b,d') = \min_{W,b,d} E[L(x,z)] \quad \text{[Relation 2]}$$

where L(x, z) is the cross-entropy loss L(x, z) shown above.

Broadly speaking, there may be two categories of strategies to achieve stateful embedding. The first one is to augment existing stateless embedding to make it stateful. For example, instead of taking an independent sample (an input vector) as the input to the stateless embedding, a system may take a window of consecutive samples (a matrix) as the input to the embedding, enabling the resultant embedding to be temporal dependent.

Figure 8:
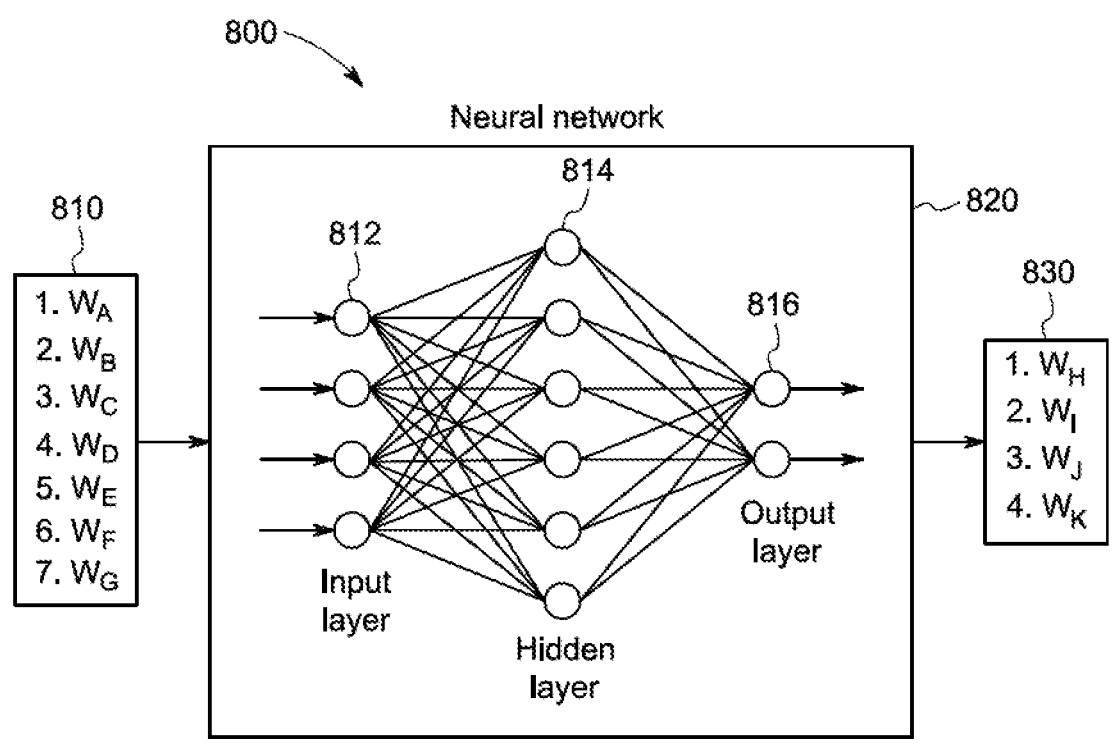
FIG. 8 is a neural network model structure for function $f_1$ in accordance with an example embodiment.

FIG. 8 shows neural network model structures corresponding to functions $f_1$ (and similar networks may be defined for $f_2$, and $f_3$). In particular, FIG. 8 illustrates 800 inputs 810 of $f_1$ being provided to neural network 820 (including an input layer 812, a hidden layer 814, and an output layer 816) which in turn creates an output (namely, $W_H$, $W_I$, $W_J$, and $W_K$).

According to some embodiments, a comparison can be made between predicted and measured output as well as the prediction errors in terms of Mean Absolute Percentage Error ("MAPE") corresponding to these three functions. It is worth noting that the three neural network models could be trained and tested based on the normal data set only. However, training can be done with both normal and abnormal data set, if the models provide values for other quantities not used in the monitoring nodes.

With the three functions being properly derived through neural network modeling, the system may construct features in a number of different ways: one way may directly use the outputs of the neural network models as features while another may use the residuals as the features (that is, the difference between the neural network outputs and the measured output corresponding to each input). Such obtained domain-level features may then be combined with the data-driven features and used as inputs to a detection engine in accordance with any of the embodiments described herein.

The extensions to features with domain-level functions may help overcome limitations of the solely data-driven approach, especially when normal and abnormal spaces are not fully explored during training stage. Some embodiments may also provide a good framework to incorporate actual control functions into features when access to such functions is available (e.g., gas turbines). The method may be applicable to any new asset from any Original Equipment Manufacturer ("OEM") provider since time series signals can be used to construct the domain-specific controller function models.

Some advantages associated with embodiments described herein may include: a flexible ability to generate features for any number/type of monitoring directly from control functions embedded in the system; making detection more sensitive to load transients (e.g., load sweeps), and providing accurate feature evolution by capturing dynamics of the system. Moreover, embodiment may be associated with an analytics application for an industrial asset modeling and/or monitoring portfolio of applications.

Figure 9:
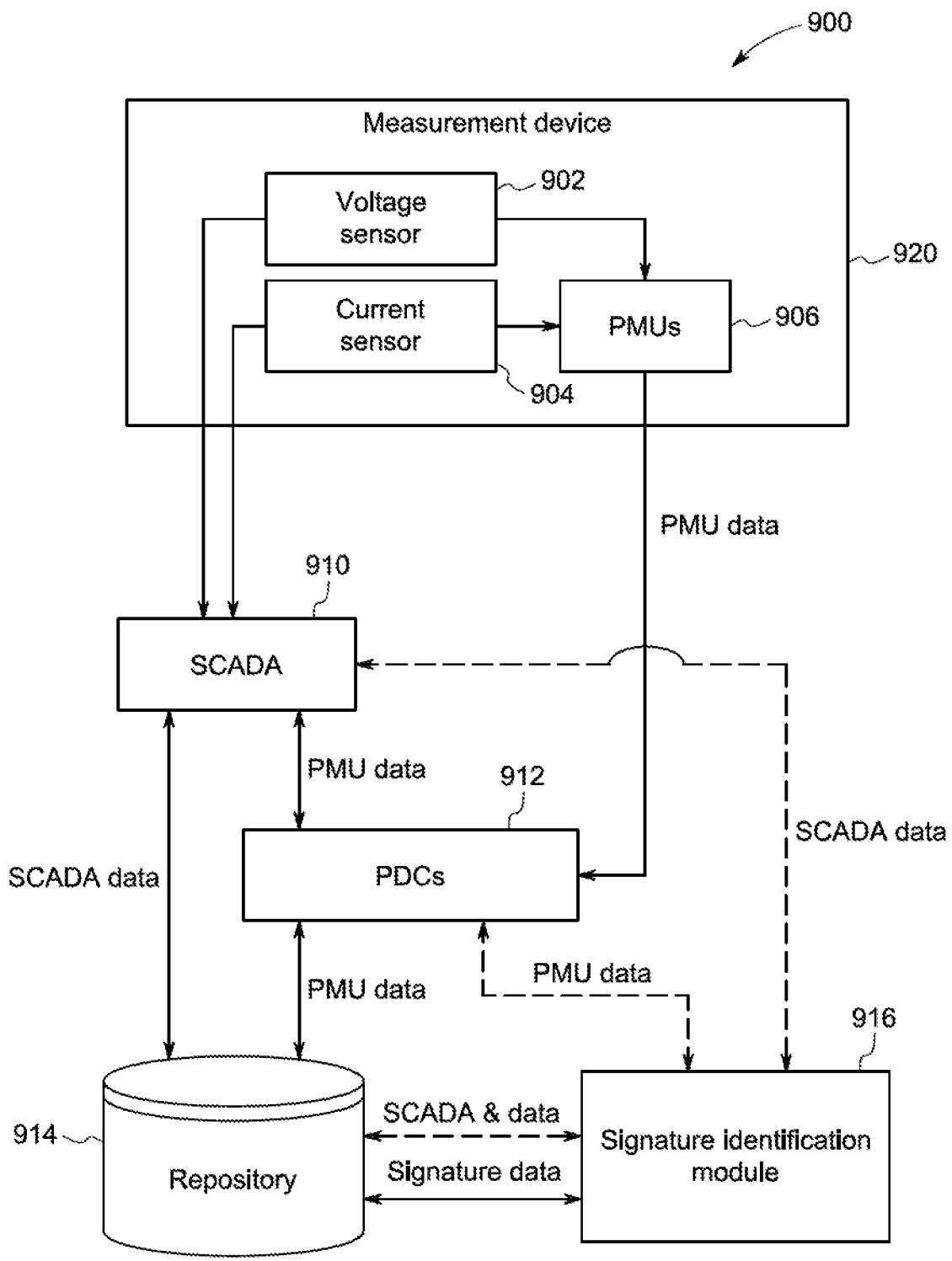
FIG. 9 illustrates a power grid system including a signature identification module in accordance with an example embodiment.

FIG. 9 illustrates a power grid system 900 including a signature identification module 916 in accordance with an example embodiment. For example, a server may implement signature identification module 916. In this example, the signature identification module 916 may monitor the health of one or more assets of a power grid system and/or of the grid itself. In some embodiments, the signature identification module 916 may also store and display asset health history for one or more assets and/or of the grid itself and a variety of other statistical information related to disturbances and events, including on a graphical user interface, or in a generated report, for example.

A measurement device 920 shown in FIG. 9 may obtain, monitor or facilitate the determination of electrical characteristics associated with the power grid system (e.g., the electrical power system), which may comprise, for example, power flows, voltage, current, harmonic distortion, frequency, real and reactive power, power factor, fault current, and phase angles. Measurement device 920 may also be associated with a protection relay, a Global Positioning System (GPS), a Phasor Data Concentrator (PDC), communication capabilities, or other functionalities.

Measurement device 920 may provide real-time measurements of electrical characteristics or electrical parameters associated with the power grid system (e.g., the electrical power system). The measurement device 920 may, for example, repeatedly obtain measurements from the power grid system which may be used by the signature identification module 916. The data generated or obtained by the measurement device 920 may comprise coded data (e.g., encoded data) associated with the power grid system that may input (or be fed into) a traditional SCADA system. Measurement device 920 may also comprise one or more PMUs 906 which may repeatedly obtain subs-second measurements (e.g., 30 times per second). Here, the PMU data may be fed into, or input into, various applications (e.g., Wide Area Monitoring System (WAMS) and WAMS-related applications) that may utilize the more dynamic PMU data (explained further below).

In the example embodiment illustrated in FIG. 9, measurement device 920 may include a voltage sensor 902 and a current sensor 904 that feed data typically via other components, to, for example, a SCADA component 910. Voltage and current magnitudes may be measured and reported to a system operator every few seconds by the SCADA component 910. SCADA component 910 may provide functions such as data acquisition, control of power plants, and alarm display. SCADA component 910 may also allow operators at a central control center to perform or facilitate management of energy flow in the power grid system. For example, operators may use a SCADA component (e.g., using a computer such as a laptop or desktop) to facilitate performance of certain tasks such opening or closing circuit breakers, or other switching operations which may divert the flow of electricity.

In some examples, the SCADA component 910 may receive measurement data from Remote Terminal Units (RTUs) connected to sensors in the power grid system, Programmable Logic Controllers (PLCs) connected to sensors in the power grid system, or a communication system (e.g., a telemetry system) associated with the power grid system. PLCs and RTUs may be installed at power plants, substations, and the intersections of transmission and distribution lines, and may be connected to various sensors, including the voltage sensor 902 and the current sensor 904. The PLCs and RTUs may receive data from various voltage and current sensors to which they are connected. The PLCs and RTUs may convert the measured information to digital form for transmission of the data to the SCADA component 910. In example embodiments, the SCADA component 910 may also comprise a central host server or servers called master terminal units (MTUs), sometimes also referred to as a SCADA center. The MTU may also send signals to PLCs and RTUs to control equipment through actuators and switchboxes. In addition, the MTU may perform controlling, alarming, and networking with other nodes, etc. Thus, the SCADA component 910 may monitor the PLCs and RTUs and may send information or alarms back to operators over telecommunications channels.

The SCADA component 910 may also be associated with a system for monitoring or controlling devices in the power grid system, such as an signature identification system. An signature identification system may comprise one or more systems of computer-aided tools used by operators of the electric power grid systems to monitor and characterize the health of one or more assets of a power grid system and/or of the grid itself. SCADA component 910 may be operable to send data (e.g., SCADA data) to a repository 914, which may in turn provide the data to the signature identification module 916. Other systems with which the signature identification module 916 may be associated may comprise a situational awareness system for the power grid system, a visualization system for the power grid system, a monitoring system for the power grid system or a stability assessment system for the power grid system, for example.

SCADA component 910 may generate or provide SCADA data (e.g., SCADA data shown in FIG. 9) comprising, for example, real-time information (e.g., real-time information associated with the devices in the power grid system) or sensor information (e.g., sensor information associated with the devices in the power grid system) that may be used by the signature identification module 916. The SCADA data may be stored, for example, in a repository 914 (described further below). In example embodiments, data determined or generated by the SCADA component 910 may be employed to facilitate generation of topology data (topology data is further described below) that may be employed by the signature identification module 916 to monitor asset health.

The employment of current sensor 904 and voltage sensor 902 may allow for a fast response. Traditionally, the SCADA component 910 monitors power flow through lines, transformers, and other components relies on the taking of measurements every two to six seconds but cannot be used to observe dynamic characteristics of the power system because of its slow sampling rate (e.g., cannot detect the details of transient phenomena that occur on timescales of milliseconds (one 60 Hz cycle is 16 milliseconds). Additionally, although SCADA technology enables some coordination of transmission among utilities, the process may be slow, especially during emergencies, with much of the response based on telephone calls between human operators at the utility control centers. Furthermore, most PLCs and RTUs were developed before industry-wide standards for interoperability were established, and as such, neighboring utilities often use incompatible control protocols.

The measurement device 920 may also include one or more PMUs 906. A PMU 906 may comprise a standalone device or may be integrated into another piece of equipment such as a protective relay. PMUs 906 may be employed at substations and may provide input into one or more software tools (e.g., WAMS, SCADA, EMS, and other applications). A PMU 906 may use voltage and current sensors (e.g., voltage sensors 902, current sensors 904) that may measure voltages and currents at principal intersecting locations (e.g., substations) on a power grid using a common time source for synchronization and may output accurately time-stamped voltage and current phasors. The resulting measurement is often referred to as a synchrophasor (although the term "synchrophasor" refers to the synchronized phasor measurements taken by the PMUs 906, some have also used the term to describe the device itself). Because these phasors are truly synchronized, synchronized comparison of two quantities is possible in real time, and this time synchronization allows synchronized real-time measurements of multiple remote measurement points on the grid.

In addition to synchronously measuring voltages and currents, phase voltages and currents, frequency, frequency rate-of-change, circuit breaker status, switch status, etc., the high sampling rates (e.g., 30 times a second) provides "sub-second" resolution in contrast with SCADA-based measurements. These comparisons may be used to assess system conditions such as: frequency changes, power in megawatts (MW), reactive power in mega volt ampere reactive (MVARs), voltage in kilovolts (KV), etc. As such, PMU measurements may provide improved visibility into dynamic grid conditions and/or of asset health and may allow for real-time wide area monitoring of power system and/or asset health dynamics. Further, synchrophasors account for the actual frequency of the power delivery system at the time of measurement. These measurements are important in alternating current (AC) power systems, as power flows from a higher to a lower voltage phase angle, and the difference between the two relates to power flow. Large phase angle differences between two distant PMUs may indicate the relative stress across the grid, even if the PMUs are not directly connected to each other by a single transmission line. This phase angle difference may be used to identify power grid instability, and a PMU may be used to generate an angle disturbance alarm (e.g., angle difference alarm) when it detects a phase angle difference.

Examples of disturbances that may cause the generation of an angle disturbance alarm may comprise, for example, a line out or line in disturbance (e.g., a line out disturbance in which a line that was in service has now gone out of service, or in the case of a line in disturbance, in which case a line that was out of service has been brought back into service). PMUs 906 may also be used to measure and detect frequency differences, resulting in frequency alarms being generated. As an example, unit out and unit in disturbances may result in the generation of a frequency alarm (e.g., a generating unit was in service, but may have gone out of service, or a unit that was out of service has come back in to service—both may cause frequency disturbances in the system that may result in the generation of a frequency alarm.). Still yet, PMUs 906 may also be used to detect oscillation disturbances (e.g., oscillation in the voltage, frequency, real power—any kind of oscillation), which may result in the generation of an alarm (e.g., oscillation alarm). Several other types of alarms may be generated based on PMU data from PMU based measurements. Although the disturbances mentioned (e.g., line in/out, unit in/out, load in/out) may result in angle or frequency disturbance alarms, an angle or frequency disturbance alarm may not necessarily mean that a particular type of disturbance occurred, only that it is indicative of that type of disturbance. For example, if a frequency disturbance alarm is detected, it may not necessarily be a unit in or unit out disturbance but may be a load in or load out disturbance. The measurement requirements and compliance tests for a PMU 906 have been standardized by the Institute of Electrical and Electronics Engineers (IEEE), namely IEEE Standard C37.118.

In the example of FIG. 9, one or more Phasor Data Concentrators (PDCs) 912 are shown, which may comprise local PDCs at a substation. Here, PDCs 912 may be used to receive and time-synchronized PMU data from multiple PMUs 906 to produce a real-time, time-aligned output data stream. A PDC may exchange phasor data with PDCs at other locations. Multiple PDCs may also feed phasor data to a central PDC, which may be located at a control center. Through the use of multiple PDCs, multiple layers of concentration may be implemented within an individual synchrophasor data system. The PMU data collected by the PDC 912 may feed into other systems, for example, a central PDC, corporate PDC, regional PDC, the SCADA component 910 (optionally indicated by a dashed connector), energy management system (EMS), synchrophasor applications software systems, a WAMS, the signature identification module 916, or some other control center software system. With the very high sampling rates (typically 10 to 60 times a seconds) and the large number of PMU installations at the substations that are streaming data in real time, most phasor acquisition systems comprising PDCs are handling large amounts of data. As a reference, the central PDC at Tennessee Valley Authority (TVA), is currently responsible for concentrating the data from over 90 PMUs and handles over 31 gigabytes (GBs) of data per day.

In this example, the measurement device 920, the SCADA component 910, and PDCs/Central PDCs 912, may provide data (e.g., real-time data associated with devices, meters, sensors or other equipment in the power grid system) (including SCADA data and topology data), that may be used by the signature identification module 916 for asset health monitoring. Both SCADA data and PMU data may be stored in one or more repositories 914. In some example embodiments, the SCADA data and PMU data may be stored into the repository 914 by the SCADA component 910, or by the PDC 912. In other embodiments, the signature identification module 916 may have one or more components or modules that are operable to receive SCADA data and PMU data and store the data into the repository 914 (indicated by dashed lines). The repository 914 may comprise a local repository, or a networked repository. The data on the repository 914 may be accessed by SCADA component 910, the PDCs 912, other systems (not shown), and optionally by example embodiments of the signature identification module 916. In example embodiments, the signature identification module 916 may be operable to send instructions to one or more other systems (e.g., SCADA component 910, PDCs 912) to retrieve data stored on the repository 914 and provide it to the signature identification module 916. In other embodiments, the signature identification module 916 may facilitate retrieval of the data stored in repository 914, directly.

In example embodiments, the data stored in the repository 914 may be associated SCADA data and PMU data. The data may be indicative of measurements by measurement device 920 that are repeatedly obtained from a power grid system. In example embodiments, the data in repository 914 may comprise PMU/SCADA-based equipment data, such as, for example, data associated with a particular unit, line, transformer, or load within a power grid system (e.g., power grid system 900). The data may comprise voltage measurements, current measurements, frequency measurements, phasor data (e.g., voltage and current phasors), etc. The data may be location-tagged. For example, it may comprise a station identification of a particular station in which a power delivery device being measured is located (e.g., "CANADA8"). The data may comprise a particular node number designated for a location. The data may comprise the identity of the measure equipment (e.g., the identification number of a circuit breaker associated with an equipment). The data may also be time-tagged, indicating the time at which the data was measured by a measurement device. The PMU/SCADA-based equipment data may also contain, for example, information regarding a particular measurement device (e.g., a PMU ID identifying the PMU from which measurements were taken).

In example embodiments, the data stored in repository 914 may comprise not only collected and measured data from various measurement devices, the data may also comprise data derived from that collected and measured data. The data derived may comprise topology data (e.g., PMU/SCADA-based topology data), event data, and event analysis data, and signature data (data generated by signature identification module 916).

In example embodiments, the repository 914 may contain topology data (e.g., PMU/SCADA-based topology data) indicative of a topology for the power grid system 900. The topology of a power grid system may relate to the interconnections among power system components, such as generators, transformers, busbars, transmission lines, and loads. This topology may be obtained by determining the status of the switching components responsible for maintaining the connectivity status within the network. The switching components may be circuit breakers that are used to connect (or disconnect) any power system component (e.g., unit, line, transformer, etc.) to or from the rest of the power system network. Typical ways of determining topology may be by monitoring of the circuit breaker status, which may be done using measurement devices and components associated with those devices (e.g., RTUs, SCADA, PMUs). It may be determined as to which equipment has gone out of service, and actually, which circuit breaker has been opened or closed because of that equipment going out of service.

The topology data may be indicative of an arrangement (e.g., structural topology, such as radial, tree, etc.) or a power status of devices in the power grid system. Connectivity information or switching operation information originating from one or more measurement devices may be used to generate the topology data. The topology data may be based on a location of devices in the power grid system, a connection status of devices in the power grid system or a connectivity state of devices in the power grid system (e.g., devices that receive or process power distributed in throughout the power grid system, such as transformers and breakers). For example, the topology data may indicate where devices are located, and which devices in the power grid system are connected to other devices in the power grid system (e.g., where devices in the power grid system are connected, etc.) or which devices in the power grid system are associated with a powered grid connection. The topology data may further comprise the connection status of devices (e.g., a transformer, etc.) that facilitate power delivery in the power grid system, and the statuses for switching operations associated with devices in the power grid system (e.g., an operation to interrupt, energize or de-energize or connect or disconnect) a portion of the power grid system by connecting or disconnecting one or more devices in the power grid system (e.g., open or close one or more switches associated with a device in the power grid system, connect or disconnect one or more transmission lines associated with a device in the power grid system etc.). Furthermore, the topology data may provide connectivity states of the devices in the power grid system (e.g., based on connection points, based on busses, etc.).

In example embodiments, the repository 914 may contain a variety of event and event analysis data, which may be derived based on PMU data, and in some embodiments, other data as well (e.g., SCADA data, other measurement data, etc.). The data may comprise information regarding the health of one or more assets of the power grid system and/or of the grid itself. The various data stored in the repository 914, including equipment data, topology data, event data, event analysis data, signature data, and other data, may be inputs into the various functionalities and operations that may be performed by the signature identification module 916.

Figure 10:
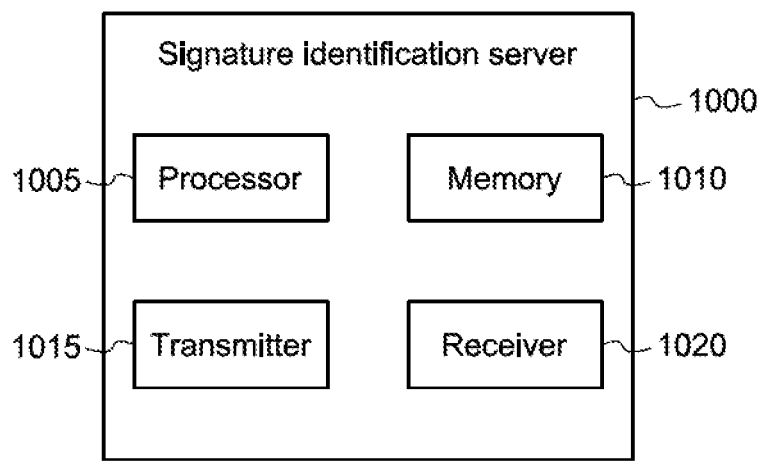
FIG. 10 illustrates a signature identification server according to an embodiment.

FIG. 10 illustrates a signature identification server 1000 according to an embodiment. For example, signature identification server 1000 may include a processor 1005, a memory 1010, a transmitter 1015, and a receiver 1020, to name just a few example components among many possibilities. For example, receiver 1020 may receive data such as PMU data, SCADA data, weather data, and other information such as DGA data and/or PD monitor data, as discussed above with respect to FIG. 2. Processor 1005 may, for example, execute program code or instructions stored in memory 1010 to process signals received by receiver 1020 to pre-process and generate one or more features from input data, generate one or more auto-associative models, one or more residuals, perform residual analysis, and identify and/or rank one or more power system event signatures based on the input data, for example. Transmitter 1015 may transmit one or more messages comprising identified power system signatures and/or additional information, such as one or more alerts, based on calculations by processor 1005.

In accordance with an embodiment, receiver 1020 may receive input measurement data from one or more data sources relating to a power grid system. The input data may comprise normal system operation measurement data and power system event measurement data. Processor 1005 may implement both an offline training phase and an online application or monitoring phase.

During the offline training phase, a first feature matrix may be generated for the normal system operation measurement data. At least one auto-associative model may additional be trained during the offline training phase based on the first feature matrix for the normal data. Moreover, normal residuals may be determined for the at least one auto-associative model for the first feature matrix for the normal system operation measurement data. Residual statistics may be determined for the normal residuals.

During the an online application or monitoring phase, a second feature matrix may be generated for the power system event measurement data. Moreover, the at least one auto-associative model and the second feature matrix for the power system event measurement data may be implemented or processed to determine power system event residuals. The power system event signatures may eb identified based on the residual statistics and the power system event residuals.

As will be appreciated based on the foregoing specification, one or more aspects of the above-described examples of the disclosure may be implemented using computer programming or engineering techniques including computer software, firmware, hardware or any combination or subset thereof. Any such resulting program, having computer-readable code, may be embodied or provided within one or more non-transitory computer readable media, thereby making a computer program product, i.e., an article of manufacture, according to the discussed examples of the disclosure. For example, the non-transitory computer-readable media may be, but is not limited to, a fixed drive, diskette, optical disk, magnetic tape, flash memory, semiconductor memory such as read-only memory (ROM), and/or any transmitting/receiving medium such as the Internet, cloud storage, the internet of things, or other communication network or link. The article of manufacture containing the computer code may be made and/or used by executing the code directly from one medium, by copying the code from one medium to another medium, or by transmitting the code over a network.

The computer programs (also referred to as programs, software, software applications, "apps", or code) may include machine instructions for a programmable processor and may be implemented in a high-level procedural and/or object-oriented programming language, and/or in assembly/machine language. As used herein, the terms "machine-readable medium" and "computer-readable medium" refer to any computer program product, apparatus, cloud storage, internet of things, and/or device (e.g., magnetic discs, optical disks, memory, programmable logic devices (PLDs)) used to provide machine instructions and/or data to a programmable processor, including a machine-readable medium that receives machine instructions as a machine-readable signal. The "machine-readable medium" and "computer-readable medium," however, do not include transitory signals. The term "machine-readable signal" refers to any signal that may be used to provide machine instructions and/or any other kind of data to a programmable processor.

The above descriptions and illustrations of processes herein should not be considered to imply a fixed order for performing the process steps. Rather, the process steps may be performed in any order that is practicable, including simultaneous performance of at least some steps. Although the disclosure has been described in connection with specific examples, it should be understood that various changes, substitutions, and alterations apparent to those skilled in the art can be made to the disclosed embodiments without departing from the spirit and scope of the disclosure as set forth in the appended claims.

Some portions of the detailed description are presented herein in terms of algorithms or symbolic representations of operations on binary digital signals stored within a memory of a specific apparatus or special purpose computing device or platform. In the context of this particular specification, the term specific apparatus or the like includes a general-purpose computer once it is programmed to perform particular functions pursuant to instructions from program software. Algorithmic descriptions or symbolic representations are examples of techniques used by those of ordinary skill in the signal processing or related arts to convey the substance of their work to others skilled in the art. An algorithm is here, and generally, considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated.

It has proven convenient at times, principally for reasons of common usage, to refer to such signals as bits, data, values, elements, symbols, characters, terms, numbers, numerals or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

It should be understood that for ease of description, a network device (also referred to as a networking device) may be embodied and/or described in terms of a computing device. However, it should further be understood that this description should in no way be construed that claimed subject matter is limited to one embodiment, such as a computing device and/or a network device, and, instead, may be embodied as a variety of devices or combinations thereof, including, for example, one or more illustrative examples.

The terms, "and", "or", "and/or" and/or similar terms, as used herein, include a variety of meanings that also are expected to depend at least in part upon the particular context in which such terms are used. Typically, "or" if used to associate a list, such as A, B or C, is intended to mean A, B, and C, here used in the inclusive sense, as well as A, B or C, here used in the exclusive sense. In addition, the term "one or more" and/or similar terms is used to describe any feature, structure, and/or characteristic in the singular and/or is also used to describe a plurality and/or some other combination of features, structures and/or characteristics. Likewise, the term "based on" and/or similar terms are understood as not necessarily intending to convey an exclusive set of factors, but to allow for existence of additional factors not necessarily expressly described. Of course, for all of the foregoing, particular context of description and/or usage provides helpful guidance regarding inferences to be drawn. It should be noted that the following description merely provides one or more illustrative examples and claimed subject matter is not limited to these one or more illustrative examples; however, again, particular context of description and/or usage provides helpful guidance regarding inferences to be drawn.

While certain exemplary techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all implementations falling within the scope of the appended claims, and equivalents thereof.

What is claimed is:

1. A system to identify power system event signatures, the system comprising:
   a receiver to receive input measurement data from one or more data sources relating to a power grid system, wherein the input measurement data comprises normal system operation measurement data and power system event measurement data; and
   a processor to:
      during an online application phase:
         generate a first feature matrix for the power system event measurement data,
         process at least one trained auto-associative model and the first feature matrix for the power system event measurement data to determine power system event residuals, and
         identify the power system event signatures based on residual statistics for normal system operation measurement data residuals and the power system event residuals.

2. The system of claim 1, wherein the processor is to further:
   during an offline training phase:
      generate a second feature matrix for the normal system operation measurement data,
      train the at least one auto-associative model based on the second feature matrix for the normal system operation measurement data, and
      determine the residual statistics for the normal system operation measurement data residuals, wherein the normal system operation measurement data residuals are determined by applying the second feature matrix for the normal system operation measurement data to the at least one trained auto-associative model.

3. The system of claim 1, wherein the input measurement data comprises one or more of phasor measurement unit (PMU) data, Supervisory Control and Data Acquisition (SCADA) data, weather data, dissolved gas analysis (DGA) sensors, and/or partial discharge (PD) monitor sensor data.

4. The system of claim 1, wherein extracted features of at least one of the first and second feature matrixes are associated with at least one of: (i) principal components, (ii) statistical features, (iii) time series analysis features, (iv) frequency domain features, (v) geographic or position based features, (vi) interaction features, (vii) logical features, (viii) deep learning features, and (ix) domain specific features.

5. The system of claim 1, wherein the processor is to further identify one or more power system events based on a comparison of more of more extracted features and one or more of the power system event signatures.

6. The system of claim 5, wherein the one or power system events comprise one or more of: an instrument pre-failure, a transformer health index, an instrument drifting, a loose connection, or a breaker mis-operation.

7. The system of claim 2, wherein extracted features of at least one of the first and second feature matrixes are based on calculations made over a sliding window of time-series measurements of the input measurement data.

8. The system of claim 2, further comprising pre-processing on the input measurement data prior to generating the first and second feature matrixes.

9. The system of claim 1, wherein the auto-associative model comprises an autoencoder neural network.

10. The system of claim 1, wherein the auto-associative model comprises a similarity-based model.

11. The system of claim 1, wherein the residual statistics comprise at least one of: mean, standard deviation, kurtosis, skewness, mode, median, quartile, range, and interquartile range.

12. A method to identify power system event signatures, the method comprising:
    receiving input measurement data from one or more data sources relating to a power grid system;
    during an online application phase:
       generating a first feature matrix for the power system event measurement data,
       processing at least one trained auto-associative model and the first feature matrix for the power system event measurement data to determine power system event residuals, and
       identifying the power system event signatures based on residual statistics for normal system operation measurement data residuals and the power system event residuals.

13. The method of claim 12, further comprising:
    during an offline training phase:
       generating a second feature matrix for the normal system operation measurement data,
       training the at least one auto-associative model based on the second feature matrix for the normal system operation measurement data, and
       determining the residual statistics for the normal system operation measurement data residuals, wherein the normal system operation measurement data residuals are determined by applying the second feature matrix for the normal system operation measurement data to the at least one trained auto-associative model.

14. The method of 12, wherein the input measurement data comprises one or more of phasor measurement unit (PMU) data, Supervisory Control and Data Acquisition (SCADA) data, weather data, dissolved gas analysis (DGA) sensors, and/or partial discharge (PD) monitor sensor data.

15. The method of 13, wherein extracted features of at least one of the first and second feature matrixes are associated with at least one of: (i) principal components, (ii) statistical features, (iii) time series analysis features, (iv) frequency domain features, (v) geographic or position based features, (vi) interaction features, (vii) logical features, (viii) deep learning features, and (ix) domain specific features.

16. An article, comprising:
a non-transitory storage medium comprising machine-readable instructions executable by one or more processors to:
during an online application phase:
generate a first feature matrix for the power system event measurement data,
process at least one trained auto-associative model and the first feature matrix for power system event measurement data to determine power system event residuals, and
identify the power system event signatures based on residual statistics for normal system operation measurement data residuals and the power system event residuals.

17. The article of claim 16, wherein the machine-readable instructions are further executable by the one or more processors to further:

during an offline training phase:
generate a second feature matrix for the normal system operation measurement data,
train the at least one auto-associative model based on the second feature matrix for the normal system operation measurement data, and
determine the residual statistics for the normal system operation measurement data residuals, wherein the normal system operation measurement data residuals are determined by applying the second feature matrix for the normal system operation measurement data to the at least one trained auto-associative model.

18. The article of claim 16, wherein the input measurement data comprises one or more of phasor measurement unit (PMU) data, Supervisory Control and Data Acquisition (SCADA) data, weather data, dissolved gas analysis (DGA) sensors, and/or partial discharge (PD) monitor sensor data.

19. The article of claim 16, wherein the power system event comprises one or more of: an instrument pre-failure, a transformer health index, an instrument drifting, a loose connection, or a breaker mis-operation.

20. The article of claim 17, wherein extracted features of at least one of the first and second feature matrixes are based on calculations made over a sliding window of time-series measurements of the input measurement data.

* * * * *